United States Patent
Nishimura et al.

(10) Patent No.: US 10,915,018 B2
(45) Date of Patent: Feb. 9, 2021

(54) IMPRINTING SYSTEM, METHOD OF MANUFACTURING SEMICONDUCTOR DEVICE, AND RECORDING MEDIUM

(71) Applicant: Toshiba Memory Corporation, Minato-ku (JP)

(72) Inventors: Takahito Nishimura, Kuwana (JP); Yoshihisa Kawamura, Yokkaichi (JP); Hironobu Tamura, Yokkaichi (JP); Kiminori Yoshino, Kuwana (JP); Suigen Kanda, Nagoya (JP)

(73) Assignee: Toshiba Memory Corporation, Minato-ku (JP)

( * ) Notice: Subject to any disclaimer, the term of this patent is extended or adjusted under 35 U.S.C. 154(b) by 127 days.

(21) Appl. No.: 16/108,485

(22) Filed: Aug. 22, 2018

(65) Prior Publication Data

US 2019/0243236 A1    Aug. 8, 2019

(30) Foreign Application Priority Data

Feb. 8, 2018    (JP) .................................. 2018-021259

(51) Int. Cl.
  *G03F 7/00*    (2006.01)
  *B05D 1/32*    (2006.01)
  (Continued)

(52) U.S. Cl.
  CPC ........... *G03F 7/0002* (2013.01); *B05D 1/322* (2013.01); *B29C 59/002* (2013.01); *B29C 59/02* (2013.01);
  (Continued)

(58) Field of Classification Search
  CPC ..... B29C 59/02; B29C 59/022; B29C 59/026; B29C 59/002; B29C 59/16; B29C 59/04;
  (Continued)

(56) References Cited

U.S. PATENT DOCUMENTS 7,148,142 B1 * 12/2006 Dakshina-Murthy ....................... B82Y 10/00
                                          438/678
9,046,763 B2    6/2015 Koshiba et al.
(Continued)

FOREIGN PATENT DOCUMENTS

JP    2010-225693    10/2010
JP    2011-159764    8/2011
(Continued)

*Primary Examiner* — Joseph S Del Sole
*Assistant Examiner* — Lawrence D. Hohenbrink, Jr.
(74) *Attorney, Agent, or Firm* — Oblon, McClelland, Maier & Neustadt, L.L.P.

(57) ABSTRACT

An imprinting system according to an embodiment includes a first measuring device measuring an intensity of light reflected from an end of a shot area of a monitor substrate being an area on which imprinting has been performed, a dripping condition generating device generating a dripping condition of a resin-based mask material on the basis of the measured intensity of light, and an imprinting apparatus performing imprinting using the dripping condition. The imprinting apparatus includes a second measuring device measuring an intensity of light reflected from an end of a first shot area of a production substrate being an area on which imprinting has been performed, and a control unit adjusting arrangement of droplets of a resin-based mask material ejected on a second shot area of the production substrate being an area on which imprinting is to be performed on the basis of an intensity of light reflected from an end of the first shot area.

8 Claims, 9 Drawing Sheets

(51) Int. Cl.
- *B82Y 40/00* (2011.01)
- *B82Y 10/00* (2011.01)
- *B29C 59/16* (2006.01)
- *B29C 59/04* (2006.01)
- *B29C 59/00* (2006.01)
- *G03F 7/20* (2006.01)
- *B29C 59/02* (2006.01)
- *G03F 7/16* (2006.01)

(52) U.S. Cl.
CPC .......... *B29C 59/022* (2013.01); *B29C 59/026* (2013.01); *B29C 59/04* (2013.01); *B29C 59/046* (2013.01); *B29C 59/16* (2013.01); *B29C 2059/023* (2013.01); *B82Y 10/00* (2013.01); *B82Y 40/00* (2013.01); *G03F 7/161* (2013.01); *G03F 7/7065* (2013.01); *G03F 7/7085* (2013.01); *G03F 7/70483* (2013.01); *G03F 7/70491* (2013.01); *G03F 7/70616* (2013.01); *G03F 7/70808* (2013.01); *G03F 7/70908* (2013.01); *G03F 7/70916* (2013.01)

(58) Field of Classification Search
CPC . B29C 59/046; B29C 2059/023; B05D 1/322; B82Y 10/00; B82Y 40/00; G03F 7/0002; G03F 7/161; G03F 7/70808; G03F 7/70483; G03F 7/70908; G03F 7/70916; G03F 7/7085; G03F 7/70491; G03F 7/70616; G03F 7/7065
USPC ........................................................ 425/385
See application file for complete search history.

(56) References Cited

U.S. PATENT DOCUMENTS

| | | | |
|---|---|---|---|
| 9,381,540 | B2 | 7/2016 | Koshiba et al. |
| 9,389,513 | B2 | 7/2016 | Koshiba |
| 2013/0251906 | A1 | 9/2013 | Takimoto |
| 2015/0234287 | A1 | 8/2015 | Tanaka |
| 2017/0136683 | A1* | 5/2017 | Nishimura ............ G03F 7/0002 |

FOREIGN PATENT DOCUMENTS

| | | |
|---|---|---|
| JP | WO2013/018569 A1 | 2/2013 |
| JP | 2013-197389 | 9/2013 |
| JP | 2014-72319 | 4/2014 |
| JP | 2015-153953 | 8/2015 |

* cited by examiner

FIG.3A
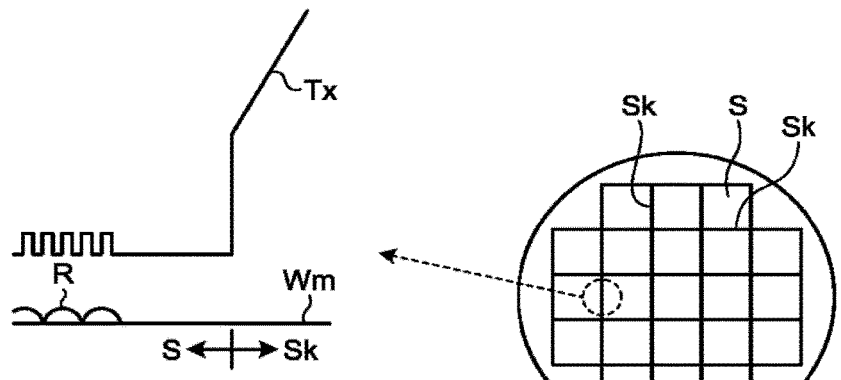
FIG.3B
FIG.3C
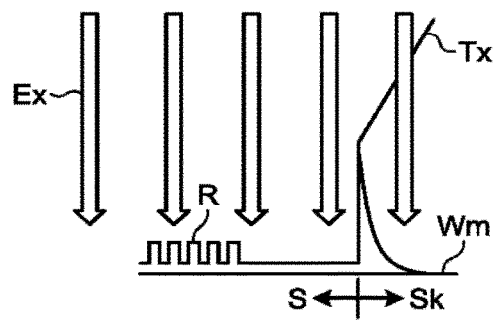
FIG.3D
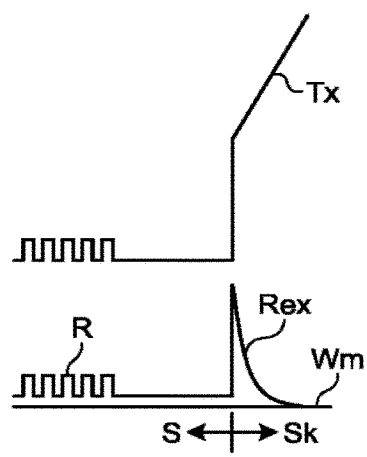

IMPRINTING SYSTEM, METHOD OF MANUFACTURING SEMICONDUCTOR DEVICE, AND RECORDING MEDIUM

CROSS-REFERENCE TO RELATED APPLICATIONS

This application is based upon and claims the benefit of priority front Japanese Patent Application No. 2016-021259, filed on Feb. 8, 2018; the entire contents of which are incorporated herein by reference.

FIELD

Embodiments of the present invention relate an imprinting system, a method of manufacturing a semiconductor device, and a recording medium.

BACKGROUND

As a method of forming a fine pattern, an imprinting method has been proposed. In the imprinting method, resist is applied to a film to be processed, a template having a fine pattern thereon is pressed onto the resist, recessed portions on the template is filled with the resist, and ultraviolet light is emitted to cure the resist. The template is removed from the resist, and the resist is formed into a mask used for processing the film to be processed.

Incidentally, in related art, for example, improvement of protrusion defects of resist in imprinting has been demanded.

BRIEF DESCRIPTION OF THE DRAWINGS

FIG. 3A to FIG. 3D are schematic diagrams illustrating generation of a protrusion defect on a monitor wafer;

DETAILED DESCRIPTION

An imprinting system according to an embodiment includes a first measuring device, a dripping condition generating device, and an imprinting apparatus. The first measuring device measures an intensity of light reflected from an end of a shot area of a monitor substrate being an area on which imprinting has been performed. The dripping condition generating device generates a dripping condition of a resin-based mask material on the basis of the measured intensity of light. The imprinting apparatus performs imprinting using the dripping condition. The imprinting apparatus includes a second measuring device and a control unit. The second measuring device measures an intensity of light reflected from an end of a first shot area of a production substrate being an area on which imprinting has been performed. The control unit adjusts arrangement of droplets of a resin-based mask material ejected on a second shot area of the production substrate being an area on which imprinting is to be performed on the basis of an intensity of light reflected from an end of the first shot area.

Hereinafter, the present invention will be described in detail with reference to the drawings. It should be noted that the present invention is not limited to the following embodiments. Furthermore, component elements in the following embodiments include component elements which are readily conceivable by a person skilled in the art or which are substantially identical.

Embodiments

With reference to FIGS. 1 to 10, an imprinting system according to an embodiment will be described.

(Exemplary Configuration of Imprinting System)

Figure 1:
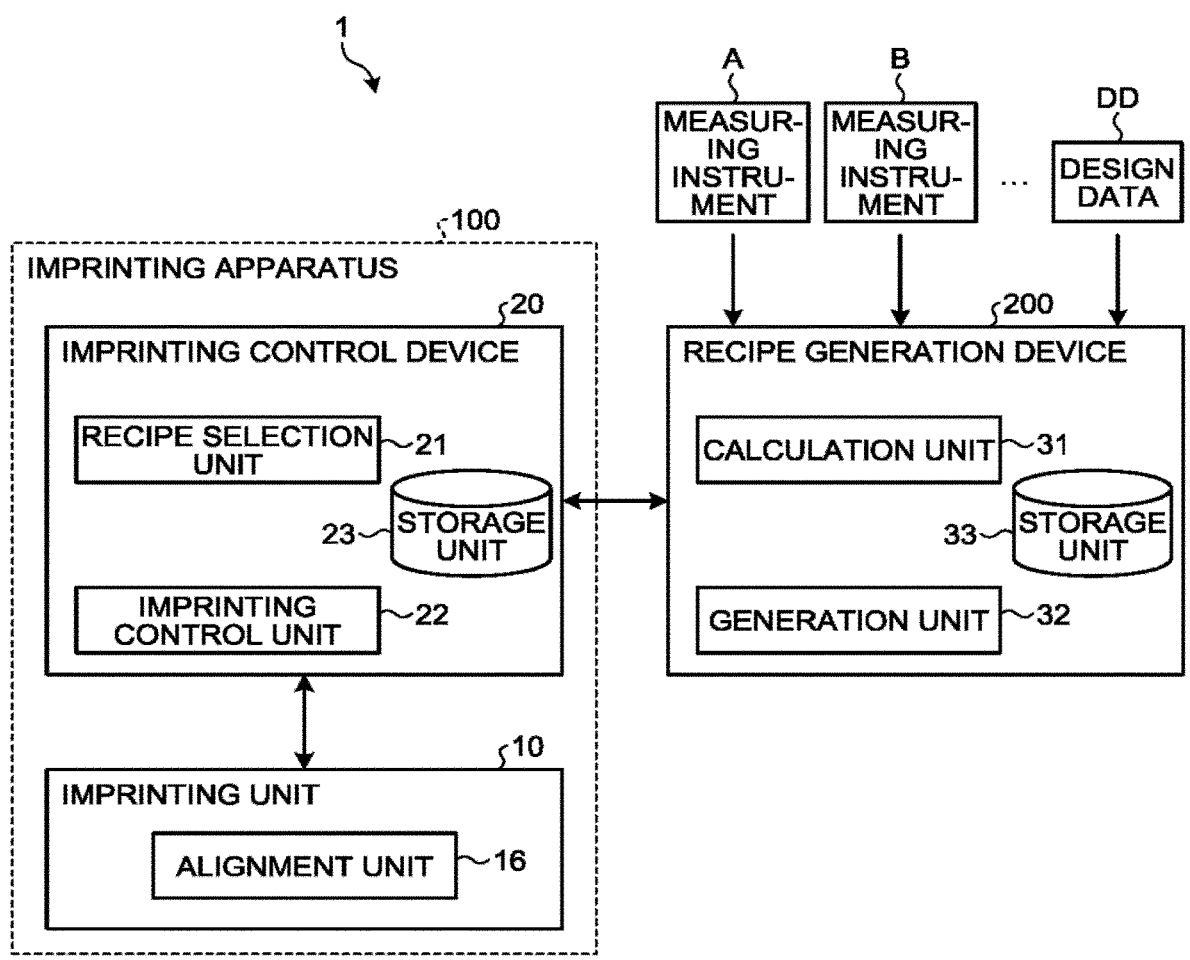
FIG. 1 is a diagram illustrating an overall configuration of an imprinting system according to an embodiment.

FIG. 1 is a diagram illustrating an overall configuration of an imprinting system 1 according to an embodiment. As illustrated in FIG. 1, the imprinting system 1 includes a measuring instrument A as a first measuring device, a recipe generation device 200 as dripping condition generating device, and an imprinting apparatus 100. The measuring instrument A measures an intensity of light reflected from an end of a shot area of a monitor wafer as a monitor substrate, and the shot area is an area on which imprinting has been performed. The recipe generation device 200 generates a drop recipe on the basis of the measured intensity of light. The imprinting apparatus 100 performs imprinting using the drop recipe. The imprinting apparatus 100 and the recipe generation device 200 are communicably connected to each other.

The imprinting apparatus 100 includes an imprinting unit 10, and an imprinting control device 20 as a control unit. The imprinting unit 10 includes an alignment unit 16 as a second measuring device which measures an intensity of light reflected from an end of a shot area of a production wafer as a production substrate. The shot area is an area on which imprinting has been performed. On the basis of the intensity of light reflected from an end of the shot area, the imprinting control device 20 adjusts arrangement of droplets of resist ejected onto a shot area of the production wafer being an area on which imprinting is to be performed. The imprinting unit 10 and the imprinting control device 20 are communicably connected to each other. Hereinafter, the configuration of the imprinting apparatus 100 will be described specifically.

The imprinting unit 16 ejects resist onto a wafer as a substrate, and transfers a pattern on a template to the resist. The resist is elected in accordance with a drop recipe (dripping condition). The drop recipe defines the number and arrangement of droplets of resist to be ejected, the size of a droplet of resist, and the like. The resist represents, for example, a photocurable resin-based mask material which is uncured or a photocurable resin-based mask which is cured. Hereinafter, both of a liquid resin-based mask material which is not yet optically hardened and a patterned resin-based mask which has been optically hardened are called as resist.

The imprinting unit 10 includes the alignment unit 16 as described above. The alignment unit 16 aligns a wafer transported to the imprinting unit 10. The alignment unit 16 is also used to measure the intensity of light from a wafer.

The imprinting control device 20 is, for example, configured as a computer including a hardware processor such as a central processing unit (CPU), a memory, a hard disk drive (HDD), and the like.

As described above, on the basis of the intensity of light reflected from an end of a shot area, measured in the imprinting unit 10, the imprinting control device 20 adjusts arrangement of droplets of resist to be ejected onto a next shot area. To achieve such a function, the imprinting control device 20 functionally and conceptually includes a recipe selection unit 21, an imprinting control unit 22, and a storage unit 23. The recipe selection unit 21, the imprinting control unit 22, and the storage unit 23 may be achieved by executing a program by a CPU or may be achieved by dedicated hardware circuits. Furthermore, the storage unit 23 may be achieved by an HDD or the like. The recipe selection unit 21 and the imprinting control unit 22 are communicably connected to each other. The recipe selection unit 21 and the imprinting control unit 22 are further connected to the storage unit 23 to refer to various information stored in the storage unit 23.

The recipe selection unit 21 selects a drop recipe used for imprinting by the imprinting unit 10. The selection of a drop recipe is performed in accordance with an intensity of light obtained from the alignment unit 16

The imprinting control unit 22 controls the imprinting unit 10 to cause the imprinting unit 10 to perform imprinting.

The storage unit 23 stores a plurality of drop recipes generated by the recipe generation device 200. The respective drop recipes are associated with a plurality of intensities of light.

A plurality of measuring instruments A, B, . . . is connected to the recipe generation device 200 for transmission of measurement information. The measuring instrument A is, for example, a microscope enabling observation of a wafer in a dark field irradiated with oblique incident light. The intensity of light obtained from a wafer and coordinates from which the intensity of light is obtained are transmitted to the recipe generation device 200. Such intensity of light varies depending on the size of a protrusion defect as a protrusion defect of resist, which is described later. The other measuring instruments B and the like provide various information relating to imprinting, such as topography information (base unevenness data) including the flatness and shape of a wafer, and the residual layer thickness of the resist. Furthermore, information about design data DD is transmitted to the recipe generation device 200. The information about design data DD includes, for example, pattern density information.

The recipe generation device 200 is configured as a computer including, for example, a hardware processor such as a central processing unit (CPU), a memory, and a hard disk drive (HDD).

The recipe generation device 200 includes a calculation unit 31, a generation unit 32, and a storage unit 33. The calculation unit 31 and the generation unit 32 are communicably connected to each other. The calculation unit 31 and the generation unit 32 are further connected to the storage unit 33 to refer to various information stored in the storage unit 33.

The calculation unit 31 creates a plurality of maps, called density map, depending on the density of a transferring pattern, on the basis of information obtained from the measuring instruments B, . . . and the design data DD. That is, the density maps are a map showing an optimized number of or optimized arrangement of droplets of resist, in accordance with the density of a pattern transferred, topography, or the like.

On the basis of the density maps generated by the calculation unit 31, the generation unit 32 generates a plurality of drop recipes in accordance with the protrusion defect. At this time, the generation unit 32 determines the size of the protrusion defect of resist, on the basis of an intensity of light obtained from the measuring instrument A. The drop recipes are generated on the basis of a result of the determination.

The storage unit 23 stores a plurality of intensities of light obtained from the measuring instrument A, a plurality of sizes of the protrusion defects, and a plurality of drop recipes. These intensities of light, sizes of the defect, and drop recipes are associated with each other.

Next, a configuration of the imprinting unit 10 will be described with reference to FIG. 2.

Figure 2:
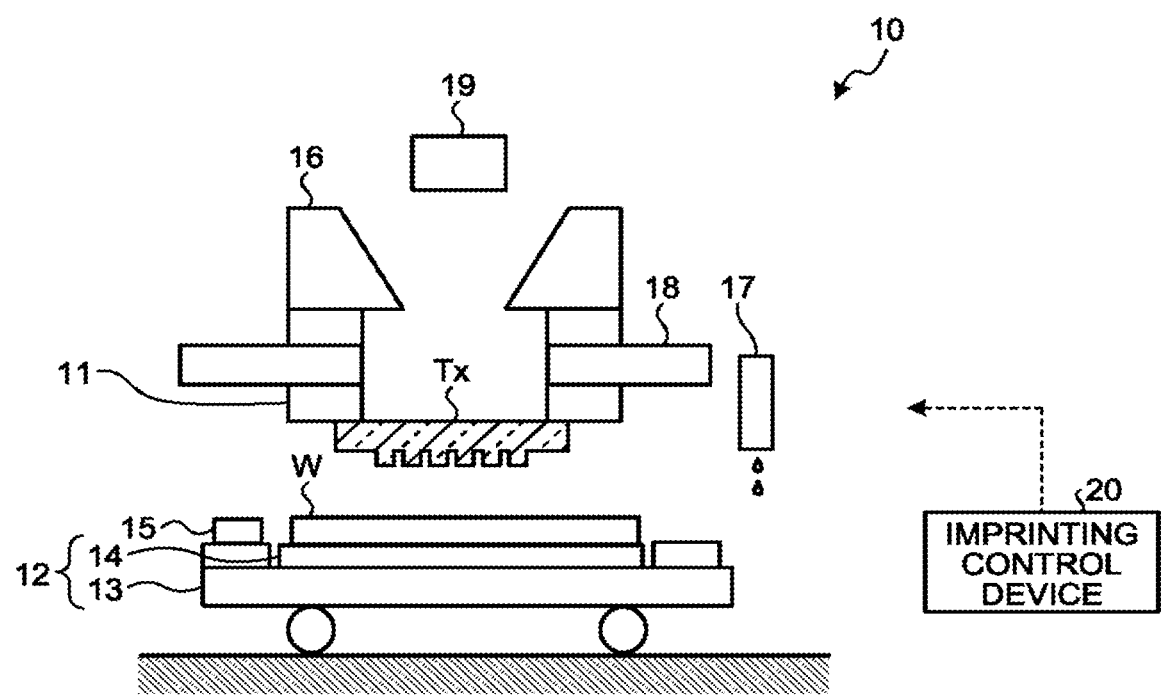
FIG. 2 is a diagram illustrating a configuration of an imprinting unit according to an embodiment.

FIG. 2 is a diagram illustrating a configuration of the imprinting unit 10 according to an embodiment. As illustrated in FIG. 2, the imprinting unit 10 includes a template stage 11, a mounting table 12, a reference mark 15, the alignment unit 16, a dripping device 17, a stage base 18, and a light source 19.

The mounting table 12 includes a wafer chuck 14 and a main body 13. The wafer chuck 14 fixes a wafer W at a predetermined position on the main body 13. On the mounting table 12, the reference mark 15 is provided. The reference mark 15 is used for alignment to load the wafer W on the mounting table 12.

The mounting table 12 receives the wafer W mounted thereon, and moves in a plane (in a horizontal plane)) parallel with the mounted wafer W. The mounting table 12 moves the wafer W to under the dripping device 17 to drip resist onto the wafer W, and moves the wafer W to under a template Tx to perform transfer to the wafer W.

The template Tx is an original plate used for, for example, nanoimprint lithography or the like. The template Tx has a lower surface side on which three-dimensional template pattern is formed.

The stage base 18 supports the template Tx by using the template stage 11, and moves up and down (in a vertical direction) to press the template pattern on the template Tx onto resist applied to the wafer W.

On the stage base 18, the alignment unit 16 is provided. The alignment unit 16 includes, for example, a microscope or the like, which is not illustrated, and detects the position of the wafer W and the position of the template Tx. Furthermore, the microscope function of the alignment unit 16 is used to detect the intensity of light from the wafer.

The dripping device 17 is a device which uses an ink-jet method to drip resist onto the wafer W. The dripping device 17 includes an ink-jet head having a plurality of micropores to eject droplets of resist, and drips the resist into a dot pattern (droplets) onto the wafer W. Dripping conditions such as the number and arrangement of droplets, and the size of droplet comply with a drop recipe.

The light source 19 is, for example, a device emitting ultraviolet light, and is provided above the stage base 18. The light source 19 emits light from above the template Tx, while the template Tx is pressed onto resist.

The imprinting control device 20 controls the template stage 11, the mounting table 12, the reference mark 15, the alignment unit 16, the dripping device 17, the stage base 18, and the light source 19.

In the imprinting process of the imprinting unit 10 configured as described above, the template Tx is pressed onto photocurable resist, recessed portions on the template Tx is filled with the resist, ultraviolet light is emitted to cure the resist, and the template Tx is removed.

Next, the protrusion defect generated during imprinting will be described.

During imprinting by the imprinting unit 10, the protrusion defect of resist is sometimes unexpectedly generated. Therefore, for example, in the imprinting unit 10, a predetermined drop recipe (e.g., a reference recipe) needs to be used for imprinting a monitor wafer to evaluate a status of a generated protrusion defect.

FIG. 3A to FIG. 3D are schematic diagrams illustrating a process in which the protrusion defect is generated on a monitor wafer Wm. As illustrated in FIG. 3, on the monitor wafer Wm, a plurality of shot areas S are arranged. As described above, one shot area S is an area which is patterned in one imprinting operation (pressing the template Tx). In one imprinting operation, several thousands to several ten thousands droplets of resist R are dripped onto each shot area S. Each area between ends of shot areas S is an inter-shot area Sk.

As illustrated in FIG. 3A, in a shot area S after ejecting the resist R, droplets of resist R are arranged in a dot pattern. As illustrated in FIG. 3B, when the template Tx is pressed onto the resist R, the pressed resist R spreads over the monitor wafer Wm, and the resist R is filled in recessed portions on the template Tx by capillarity. As illustrated in FIG. 3C, the capillarity also acts on an end of the template Tx, and part of the resist R comes out upward along a side surface of the template Tx (protrusion of the resist R). Meanwhile, the whole resist R is irradiated with exposure light Ex through the template Tx, and the resist R is optically hardened. As illustrated in FIG. 3D, the template Tx is removed, a pattern is transferred to the resist R in the shot area S, the protruded resist R at an end of the shot area S, that is, in an inter-shot area Sk remains as a projecting protrusion defect Rex. When imprinting is repeated for a plurality of monitor wafers Wm with various drop recipes, the protrusion defect Rex varies in height.

Such varying height of the protrusion defect Rex of resist R can be identified, for example, as different intensities of light by the measuring instrument A.

Figure 4:
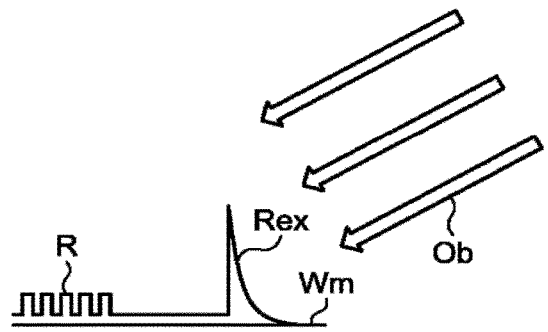
FIG. 4 is a graph illustrating a relationship between the height of a protrusion defect of resist and the intensity of light.
Figure 4:
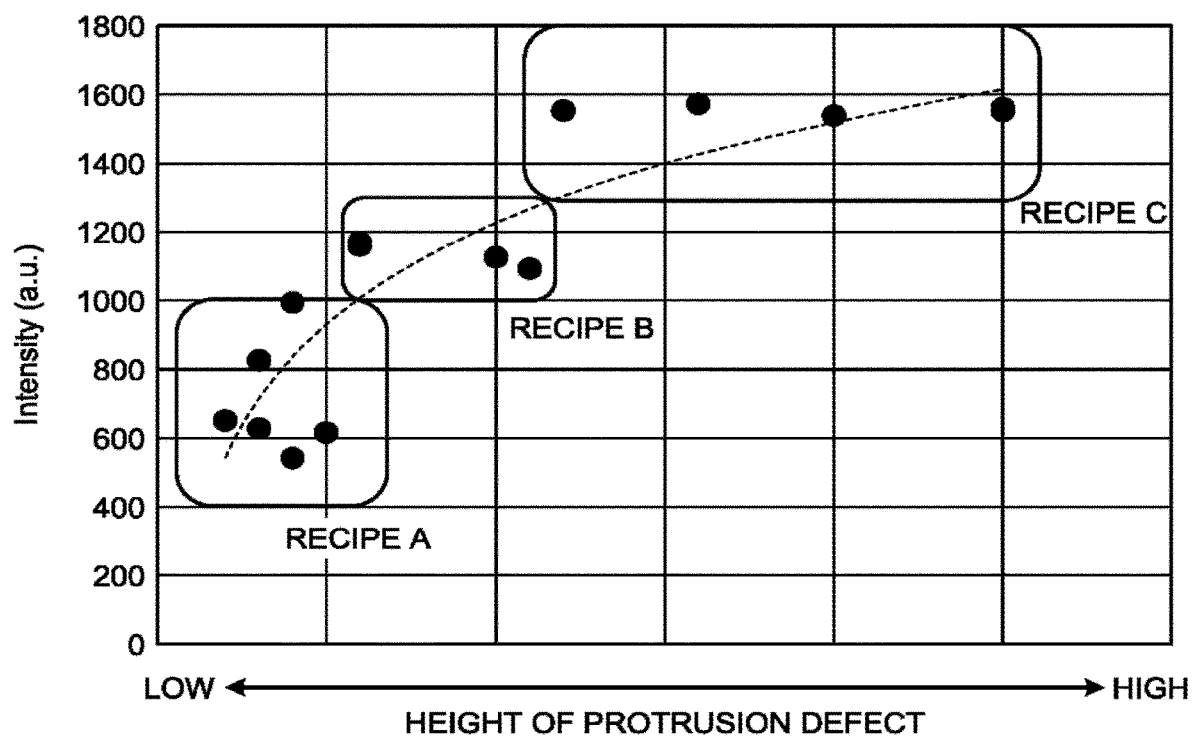

FIG. 4 is a graph illustrating a relationship between the height of the protrusion defect Rex of the resist R and the intensity of light. In FIG. 4, the horizontal axis represents the height of the protrusion defect Rex, and the vertical axis represents the intensity of light obtained by the measuring instrument A. As illustrated in FIG. 4, when the measuring instrument A emits oblique incident light Ob to a monitor wafer Wm in a dark field to observe the monitor wafer Wm, reflected light from the protrusion defect Rex indicates a predetermined intensity according to the height of the protrusion defect Rex. As illustrated in a graph of FIG. 4, the intensity of light increases with increasing height of the protrusion defect Rex.

Here, for example, the size (height) of the protrusion defect Rex is divided into three sizes of small (low), medium, and large (high) to generate drop recipes A, B, and C for each size. The size of the protrusion defect Rex significantly depends on, for example, the arrangement of droplets at an end of a shot area S. The generation unit 32 of the recipe generation device 200 modulates the arrangement of droplets depending on the size of the protrusion defect Rex to inhibit the protrusion defect Rex. The arrangement of droplets is modulated, for example, relative to the reference recipe. As described later, when the protrusion defect Rex has a large size, a large adjustment is required for arrangement of droplets, that is, a large modulation is required for the arrangement of droplets. When the protrusion defect Rex has a small size, arrangement of droplets is only required to be slightly adjusted, that is, a small modulation is required for the arrangement of droplets.

Figures 5, 6:
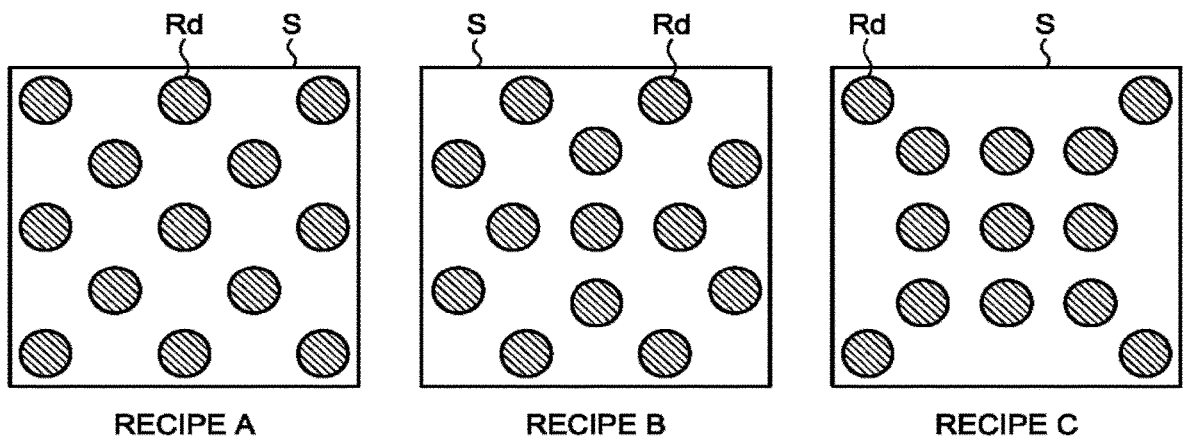
FIG. 5 is a diagram illustrating exemplary arrangements of droplets of drop recipes A, B, and C generated by a recipe generation device according to an embodiment.
FIG. 6 is a diagram illustrating an exemplary data table stored in a storage unit of an imprinting apparatus according to an embodiment.

With reference to FIG. 5, the function of the recipe generation device 200 will be described in detail.

FIG. 5 is a diagram illustrating exemplary arrangements of droplets of drop recipes A, B, and C generated by a recipe generation device according to an embodiment. As illustrated in FIG. 5, the storage unit 33 of the recipe generation device 200 stores a data table 33$dt$ representing relationships between the intensity of light obtained from the measuring instrument A, the size of the protrusion defect Rex, and the modulation of droplets Rd at an end of a shot area S. The data table 33$dt$ shows that, for example, when the intensity of light is not less than 400 and less than 1000, the size of the protrusion defect Rex is small, and a small modulation of droplets Rd at an end of the shot area S is required. Meanwhile, when the intensity of light is not less than 1300 and less than 1600, the size of the protrusion defect Rex is large, and a large modulation is required for droplets Rd at an end of the shot area S.

As described above, the recipe generation device 200 causes a larger modulation of arrangement of droplets with larger size of the protrusion defect Rex, and causes a smaller modulation of arrangement of droplets with smaller size of the protrusion defect Rex, generating a plurality of drop recipes. That is, the recipe generation device 200 generates a plurality of drop recipes in which when the size of the protrusion defect Rex is larger, droplets are adjusted to be arranged on the inner side to reduce the protrusion defect Rex.

Specifically, the generation unit 32 of the recipe generation device 200 refers to the data table 33$dt$ stored in the storage unit 33, determining the size of the protrusion defect Rex on the basis of each range of the intensity of light, creating a density map. The generation unit 32 generates an appropriate drop recipe A, B, or C depending on a determined size of the protrusion defect Rex. The drop recipe A is a recipe appropriate to a small protrusion defect Rex (intensity of light: not less than 400 and less than 1000). The drop recipe B is a recipe appropriate to a middle protrusion defect Rex (intensity of light: not less than 1000 and less than 1300). The drop recipe C is a recipe appropriate to a large protrusion defect Rex (intensity of light: not less than 1300 and less than 1800). That is, droplets Rd of the drop recipe B corresponding to the protrusion defect Rex having a medium size are arranged on the inside of the shot area S, as compared with those of the drop recipe A corresponding to the protrusion defect Rex having a small size. Furthermore, the droplets Rd of the drop recipe C corresponding to the protrusion defect Rex having a large size are arranged on the inner side of the shot area S, as compared with those of the drop recipe B. As described above, arrangement of the droplets Rd on the inner side the shot area S can reduce protrusion of the resist R to the outside the shot area S.

The plurality of drop recipes generated as described above is stored in the storage unit 33. Furthermore, the generated plurality of drop recipes is transmitted from the recipe generation device 200 to the imprinting apparatus 100, in association with the range of the intensity of light described above. The imprinting apparatus 100 stores the received drop recipes in the storage unit 23.

Note that, here, the protrusion defect Rex of resist has been mainly described, but there are disadvantageous characteristics which are to overcome to perform imprinting, including variation in residual layer thickness of resist and the like. In generation of the density map and the drop recipe, other characteristics such as the residual layer thickness of resist are evaluated using the monitor wafer Wm and the evaluated data are taken into consideration.

Next, a function of selecting a drop recipe in the imprinting apparatus 100 will be described.

As described above, the status of the generated protrusion defect Rex varies depending on the pattern of the template Tx transferred to resist R, and further differs between shot areas S and between wafers W during repetition of the imprinting process of the imprinting apparatus 100.

Therefore, in the imprinting process of the imprinting apparatus 100, measurement of the intensity of light from the protrusion defect Rex is performed on a shot area S of a production wafer on which imprinting has been performed. This measurement of intensity of light is performed, for example, for each shot area S. The production wafer represents a wafer being an intermediate product of a semiconductor device. The production wafer is imprinted using a predetermined drop recipe, and the intensity of light therefrom is measured by the alignment unit 16 of the imprinting apparatus 100 (see FIG. 2).

The imprinting control device 20 of the imprinting apparatus 100 receives the intensity of light measured by the alignment unit 16. The recipe selection unit 21 of the imprinting control device 20 refers to the storage unit 23, referring to association between intensities of light and drop recipes. The association between intensities of light and drop recipes is stored in the storage unit 23, for example, as a data table 23dt as illustrated in FIG. 6. From the association as shown in the data table 23dt, the recipe selection unit 21 selects a drop recipe according to the measured intensity of light. For example, when the measured intensity of light is 1200, the drop recipe B is selected. In this way, on the basis of the protrusion defect Rex generated in the last imprinted shot area S, an appropriate drop recipe is selected to reduce the protrusion defect Rex in a shot area S to be subsequently imprinted.

Figure 7A:
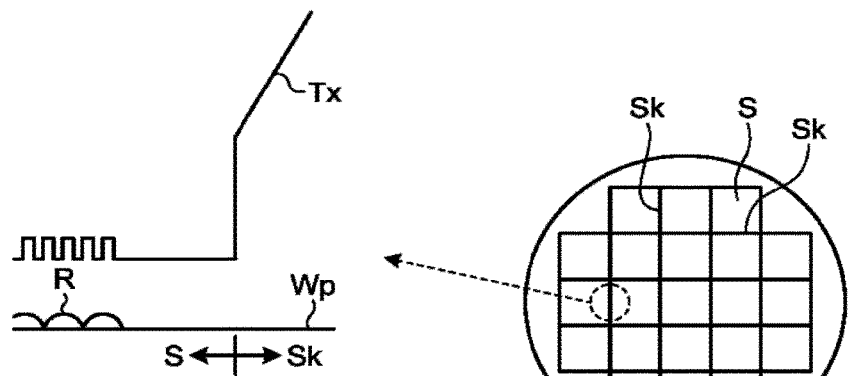
FIG. 7A to FIG. 7D are schematic diagrams illustrating an imprinting process performed on a production wafer.
Figure 7B:
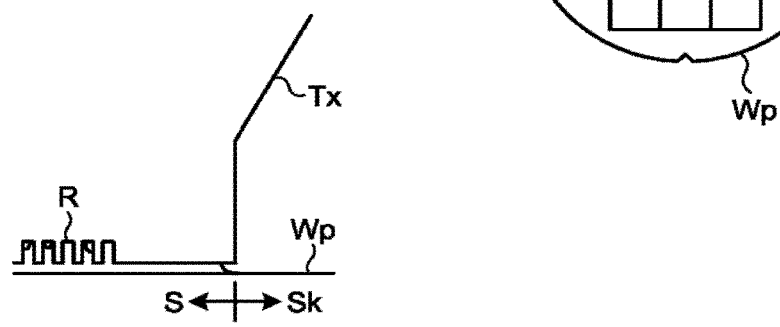
Figure 7C:
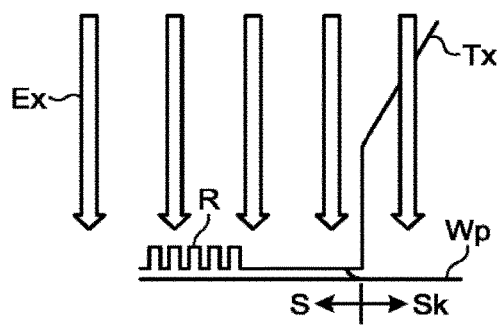
Figure 7D:
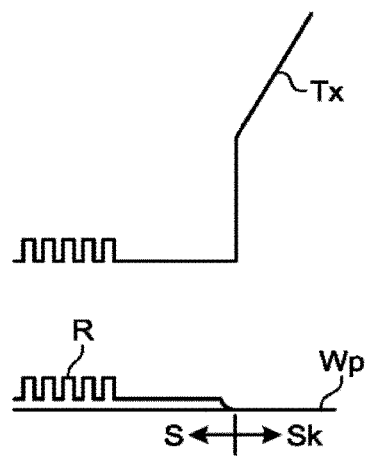

FIG. 7A to FIG. 7D are schematic diagrams illustrating a process of imprinting on a production wafer Wp. As illustrated in FIG. 7A, in a shot area S after ejecting resist R, droplets of resist R are arranged at appropriate positions. As illustrated in FIG. 7B, when the template Tx is pressed onto the resist R, the pressed resist R spreads over the production wafer Wp, and the resist R is filled in recessed portions on the template Tx by capillarity. The appropriate arrangement of the droplets reduces protrusion of the resist R from an end of the template Tx, as illustrated in FIG. 7C. Meanwhile, the whole resist R is irradiated with exposure light Tx through the template Tx, and the resist R is optically hardened. As illustrated in FIG. 7D, when the template Tx is removed, a pattern is transferred to the resist R in the shot area Such resist R is accommodated in the shot area S.

(Exemplary Process of Imprinting System)

Next, an exemplary process of the imprinting system 1 will be described with reference to FIGS. 8 to 10. The process of the imprinting system 1 includes a drop recipe generation process of the recipe generation device 200 as a step of a semiconductor device production process, and an imprinting process of the imprinting apparatus 100 as a step of the semiconductor device production process First, an exemplary drop recipe generation process will be described with reference to FIG. 8.

Figure 8:
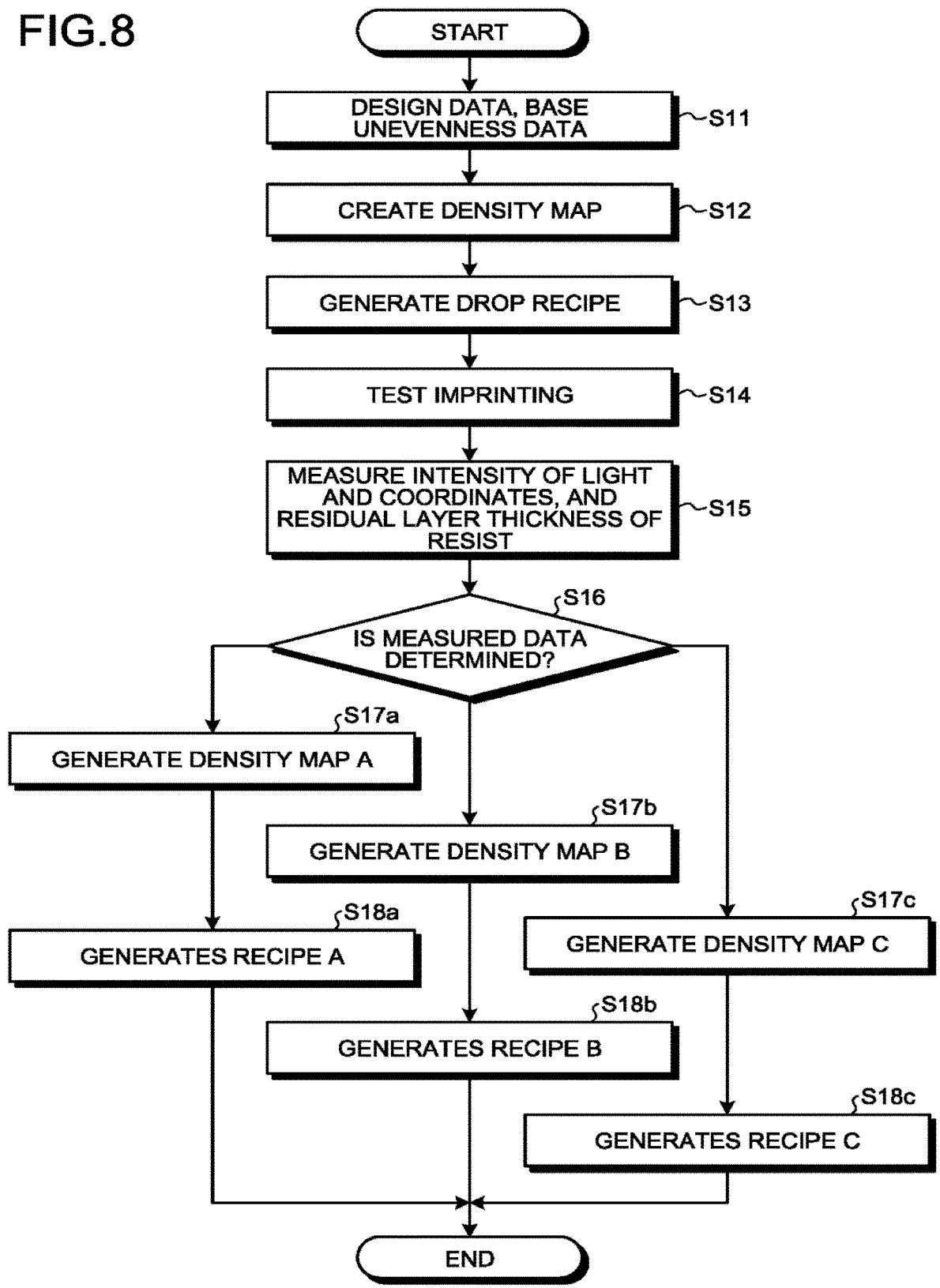
FIG. 8 is a flowchart illustrating an exemplary procedure of a drop recipe generation process in a recipe generation device according to an embodiment.

FIG. 8 is a flowchart illustrating an exemplary procedure of the drop recipe generation process in the recipe generation device 200 according to an embodiment. The drop recipe generation process described below is performed on the basis of a drop recipe generation program.

As illustrated in FIG. 8, in step S11, the recipe generation device 200 acquires design data DD and base unevenness data measured by the measuring instrument B or the like. In step S12, the calculation unit 31 creates a density map on the basis of the acquired data. In step S13, the generation unit 32 generates a drop recipe (reference recipe) on the basis of the generated density map. In step S14, on the basis of the created reference recipe, test imprinting is performed on a monitor wafer Wm by the imprinting apparatus 100. In step S15, the measuring instrument A measures the intensity of light from the monitor wafer Wm on which the imprinting is performed, and coordinates from which the intensity of light is obtained. Furthermore, the residual layer thickness of resist is measured by the measuring instrument B or the like. These data (the intensity of light, the coordinates from which the intensity of light is obtained, and the residual thickness of resist) are transmitted to the recipe generation device 200 and stored in the storage unit 33. In step S16, the calculation unit 31 refers to the data table 33dt of the storage unit 33, and on the basis of the intensity of light measured by the measuring instrument A and coordinates from which the intensity of light is obtained, the calculation unit 31 determines the size and position of the protrusion defect Rex of resist R. Then, the amount of modulation of droplets Rd is determined on the basis of the size and position of the protrusion defect Rex and the the residual layer thickness of resist, in addition to the design data DD and base unevenness data described above. Thus, in step S17a, the calculation unit 31 creates, for example, a density map A having a small amount of modulation, and in step S18a, the generation unit 32 generates a drop recipe A. Furthermore, in step S17b, the calculation unit 31 creates, for example, a density map B having a medium amount of modulation, and in step S19b, the generation unit 32 generates a drop recipe B. Furthermore, in step S17c, the calculation unit 31 creates, for example, a density map C having a large amount of modulation, and in step S18c, the generation unit 32 generates a drop recipe C.

This is the end of the drop recipe generation process of the recipe generation device 200.

Here, a hardware configuration of the recipe generation device 200 in which a drop recipe generation program 207 is executed will be described with reference to FIG. 9. FIG. 9 is a block diagram illustrating the hardware configuration in which a drop recipe generation program 207 according to an embodiment is executed.

Figure 9:
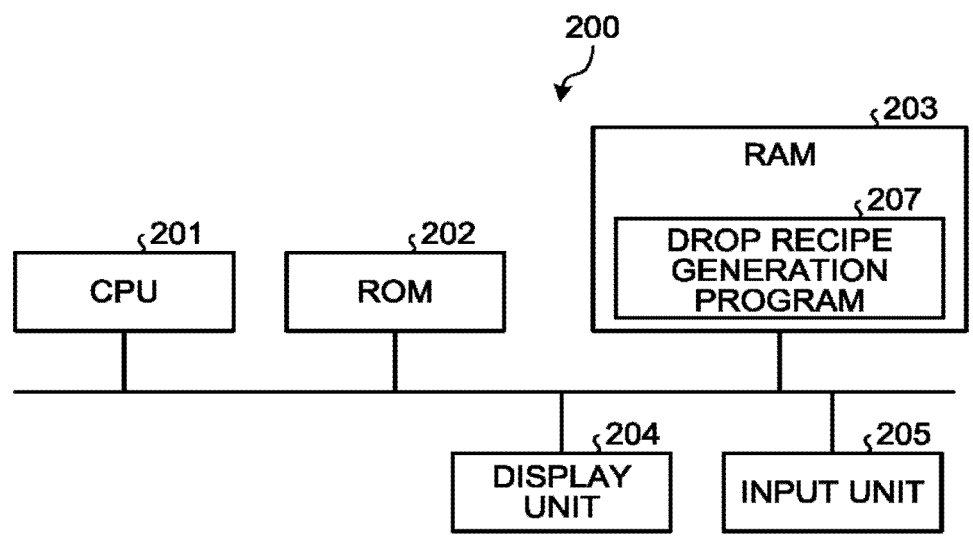
FIG. 9 is a block diagram illustrating a hardware configuration in which a drop recipe generation program according to an embodiment is executed.

As illustrated in FIG. 9, the recipe generation device 200 includes a central processing unit (CPU) 201, a read only memory (ROM) 202, a random access memory (RAM) 203, a display unit 204, and an input unit 205. In the recipe generation device 200, these CPU 201, ROM 202, RAM 203, display unit 204, and input unit 205 are connected via a bus line.

The CFU 201 uses the drop recipe generation program 207 as a computer program to set arrangement of droplets of resist. The drop recipe generation program 207 is a computer program product including a computer-readable recording medium storing a plurality of commands executable on a computer to set the arrangement of droplets. In the drop recipe generation program 207, the plurality of commands causes the computer to set the arrangement of droplets.

The display unit 204 is a display device, such as a liquid crystal monitor, and on the basis of instructions from the CPU 201, the display unit 204 displays a predetermined drop recipe, an arrangement of droplets based on the drop recipe, and the like. The input unit 205 includes a mouse, a keyboard, or the like, and inputs instruction information (parameter or the like required to set arrangement of droplets) input from outside by a user. The instruction information input to the input unit 205 is transmitted to the CPU 201.

The drop recipe generation program 207 is stored in the ROM 202 and loaded into the RAM 203 via the bus line. In FIG. 9, the drop recipe generation program 207 is loaded into the RAM 203.

The CPU 201 executes the drop recipe generation program 207 loaded into the RAM 203. Specifically, in the recipe generation device 200, in accordance with instructions input by the user from the input unit 205, the CPU 201 reads the drop recipe generation program 207 from the ROM 202, loads the drop recipe generation program 207 into a program storage area in the RAM 203, and executes various processes. The CPU 201 temporarily stores various data generated in the various processes, in a data storage area formed in the RAM 203.

The drop recipe generation program 207 executed in the recipe generation device 200 has a module configuration including the calculation unit 31 and the generation unit 32, and the calculation unit 31 and the generation unit 32 are loaded into a main storage device and formed in the main storage device.

Next, an example of an imprinting process will be described with reference to FIG. 10.

Figure 10:
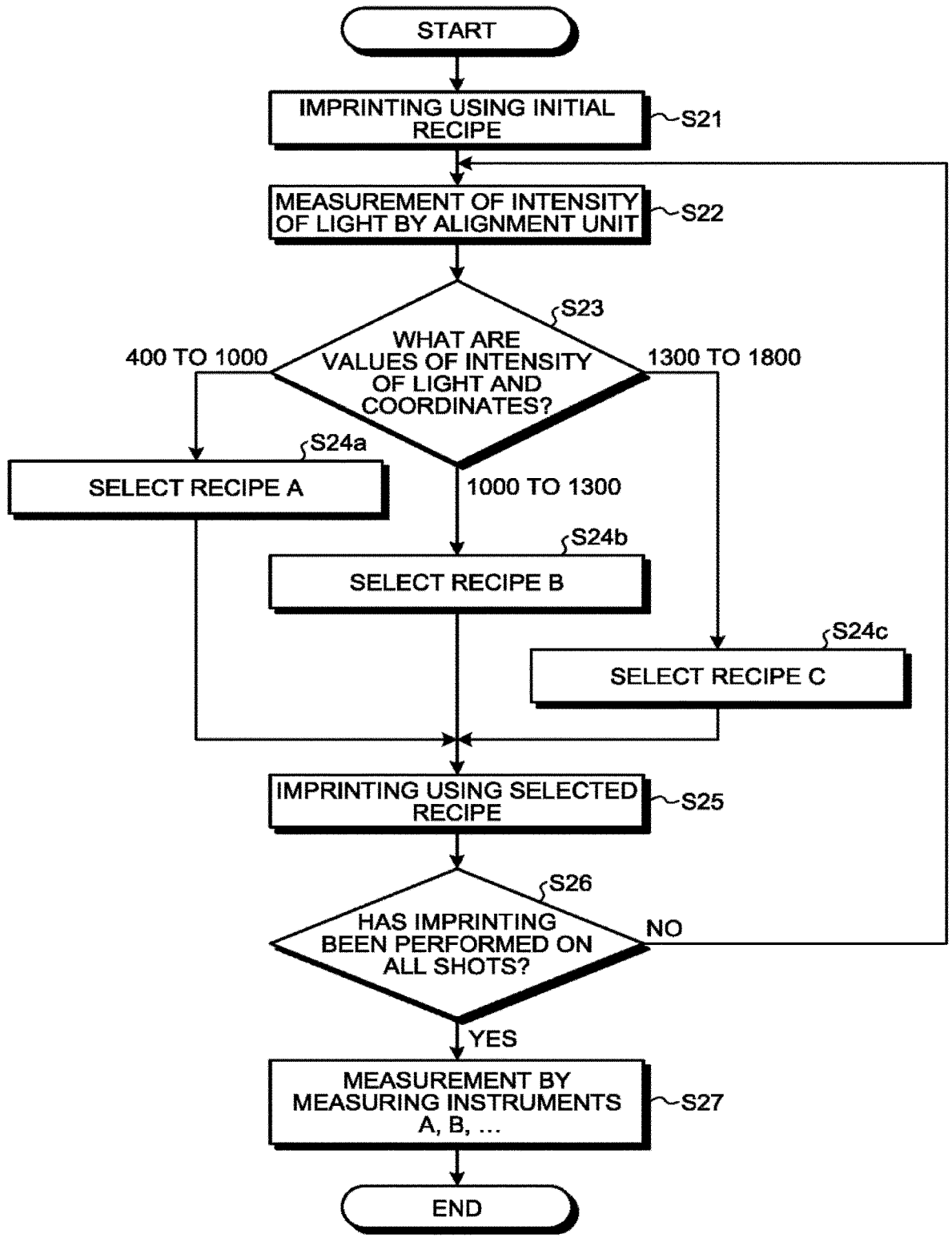
FIG. 10 is a flowchart illustrating an exemplary procedure of an imprinting process in an imprinting apparatus according to an embodiment.

FIG. 10 is a flowchart illustrating an exemplary procedure of an imprinting process in an imprinting apparatus 100 according to an embodiment. As illustrated in FIG. 10, in step S21, the imprinting apparatus 100 performs imprinting on the first shot area S of a production wafer Wp by using an initial recipe. The initial recipe is a drop recipe optimized relative to, for example, a pattern transferred to the production wafer Wp.

In step S22, the imprinting control unit 22 causes the alignment unit 16 to perform measurement of intensity of light on the shot area S on which the imprinting has been performed.

In step S23, the recipe selection unit 21 determines the intensity of light and coordinates from which the intensity of light is obtained, and proceeds to any of steps S24a to S24c depending on the numerical values of the intensity of light and the coordinates. When the intensity of light is not less than 400 and less than 1000, the recipe selection unit 21 selects the drop recipe A in step S24a. When the intensity of light is not less than 1000 and less than 1300, the recipe selection unit 21 selects the drop recipe P in step S24b. When the intensity of light is not less than 1300 and less than 1800, the recipe selection unit 21 selects the drop recipe C in step S24c.

In step S25, the imprinting control unit 22 controls the respective units of the imprinting unit 10 to perform imprinting on a next shot area S of the production wafer tip in accordance with a selected drop recipe.

In step S26, the imprinting control unit 22 determines whether the imprinting process has been performed for all shots of the production wafer Wp. In a case where the imprinting process is not performed (No), the process returns to step S22, a next drop recipe is selected on the basis of the intensity of light reflected from an end of the last shot area S on which the imprinting process has been performed, and the imprinting is performed on the next shot area S. In a case where the imprinting process has been performed (Yes), the process in the imprinting apparatus 100 is finished. In step S27, for the production wafer Wp on which imprinting has been performed, the intensity of light from each shot area S and coordinates from which the intensity of light is obtained are measured by the measuring instrument A. Furthermore, the residual layer thickness of resist in each shot area S is measured by the measuring instrument B or the like. In a case where these measurement results satisfy specifications, the production wafer Wp is transmitted to a next process. In a case where these measurement results do not satisfy the specifications, the production wafer Wp is returned to the imprinting apparatus 100 and reworked.

This is the end of the imprinting process of the imprinting apparatus 100.

Note that measurement of the intensity of light on the production wafer Wp may not be performed on each shot area S. The measurement of the intensity of light may be performed on every several shot areas S to select a drop recipe. The measurement of the intensity of light may be performed on every production wafer Wp or may be performed on every lot to select a drop recipe. Furthermore, before processing a lot, measurement of intensity of light may be performed on a monitor wafer Wm on which imprinting has been performed so that a drop recipe is selected for a production wafer Wp on the basis of a result of the measurement.

Furthermore, results of measurement of the intensity of light acquired from every shot area S or every production wafer Wp may be stored in the storage unit 23 so that the results are referred to as information about a protrusion defect Rex in a production wafer Wp, for processing performed after the imprinting process.

In a imprinting process as a comparative example, generation of a protrusion defect (protrusion defect) of resist has unfortunately caused, for example, poor processing in a semiconductor device production process following the imprinting process. However, to know whether a predetermined drop recipe generates a protrusion defect or how large a generated protrusion defect is, for example, troublesome cross-sectional observation of a wafer by a scanning electronic microscope (SEM) has been required. In a process of optimizing a drop recipe as well, cross-sectional observation of a wafer has been required for changing the drop recipe. Therefore, time is required for optimization of the drop recipe. Furthermore, there has been no way to non-destructively inspect generation of a protrusion defect on a production wafer during imprinting, making it difficult to control a protrusion defect on a production wafer.

The present inventors found that such a protrusion defect can be observed as a foreign material emitting light having a predetermined intensity when oblique light is incident on a wafer in a dark field, for example, by a microscope or the like. The present inventors further found that there is a correlation between a measured intensity of light and a size of a protrusion defect.

Such findings can be used to construct the recipe generation device 200 in the embodiment, and evaluation a protrusion defect and optimization of a drop recipe are facilitated. That is, an appropriate drop recipe can be generated on the basis of the intensity of light reflected from an end of a shot area S without requiring direct observation of a protrusion defect Rex by an SEM or the like.

Furthermore, such findings can be used to operate the imprinting apparatus 100 in the embodiment, and selection of an appropriate drop recipe before processing of a production wafer Wp is facilitated. Therefore, generation of a protrusion defect Rex on the production wafer Wp can be reduced. Even if the protrusion defect Rex is generated on the production wafer Wp, the protrusion defect Rex can be readily found out.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An imprinting system comprising:
   a first measuring device that measures an intensity of light reflected from an end of a shot area of a monitor substrate being an area on which imprinting has been performed;
   a dripping condition generating device that generates a dripping condition of a resin-based mask material on the basis of the measured intensity of light; and
   an imprinting apparatus that performs imprinting using the dripping condition,
   wherein the imprinting apparatus includes:
   a second measuring device that measures an intensity of light reflected from an end of a first shot area of a production substrate being an area on which imprinting has been performed; and
   a control unit that adjusts arrangement of droplets of a resin-based mask material ejected on a second shot area of the production substrate being an area on which imprinting is to be performed on the basis of the intensity of light reflected from the end of the first shot area.

2. The imprinting system according to claim 1, wherein the dripping condition generating device
   determines a size of a protrusion defect on the basis of the intensity of light from the monitor substrate, adjusts arrangement of the droplets depending on the size of the protrusion defect to reduce the protrusion defect, and generates a plurality of dripping conditions.

3. The imprinting system according to claim 2, wherein the dripping condition generating device
   generates a dripping condition in which the droplets are adjusted to be arranged on the inside of the shot area, when determining that the protrusion defect has a large size.

4. The imprinting system according to claim 2, wherein the dripping condition generating device
   determines that the protrusion defect has a large size when the intensity of light from the monitor substrate is high, and determines that the protrusion defect has a small size when the intensity of light from the monitor substrate is low.

5. The imprinting system according to claim 2, wherein the dripping condition generating device
   determines that the protrusion defect has a large size when the intensity of light from the monitor substrate is high, and generates a dripping condition in which the droplets are adjusted to be arranged on the inside of the shot area.

6. The imprinting system according to claim 2, wherein the dripping condition generating device
   includes a storage unit that stores a data table representing a relationship between the intensity of light measured by the first measuring device and the size of the protrusion defect, and
   determines the size of the protrusion defect on the basis of the data table.

7. The imprinting system according to claim 2, wherein the control unit of the imprinting apparatus
   selects a dripping condition in accordance with the intensity of light from the end of the first shot area, from the plurality of dripping conditions, and ejects the droplets of the resin-based mask material on the second shot area.

8. The imprinting system according to claim 7, wherein the imprinting apparatus
   includes a storage unit that stores a data table in which an expected range of numerical values of intensity of light is associated with the plurality of dripping conditions generated by the dripping condition generating device, and
   the control unit of the imprinting apparatus
   selects the dripping condition on the basis of the data table.

* * * * *